United States Patent [19]
Auffret et al.

[11] Patent Number: 5,317,580
[45] Date of Patent: May 31, 1994

[54] BIDIRECTIONAL TRANSMISSION SYSTEM WITH IDENTICAL LASER COMPONENTS

[75] Inventors: René Auffret, Perros Guirec; Mouhammad Chawki, Lannion; Louis Berthou, Rospez, all of France

[73] Assignee: France Telecom Etablissement Autonome de Droit Public, Issy Les Moulineaux, France

[21] Appl. No.: 842,152

[22] PCT Filed: Jun. 11, 1991

[86] PCT No.: PCT/FR91/00464
§ 371 Date: Mar. 27, 1992
§ 102(e) Date: Mar. 27, 1992

[87] PCT Pub. No.: WO92/22965
PCT Pub. Date: Dec. 23, 1992

[51] Int. Cl.$^5$ ............................................. H01S 3/00
[52] U.S. Cl. ........................................ 372/38; 372/96; 372/6; 385/27
[58] Field of Search ................ 372/38, 6, 96; 385/27

[56] References Cited

U.S. PATENT DOCUMENTS

| | | | |
|---|---|---|---|
| 4,972,514 | 11/1990 | Linke | 372/38 |
| 5,058,974 | 10/1991 | Mollenauer | 372/6 |
| 5,063,567 | 11/1991 | Nakajima | 372/38 |

FOREIGN PATENT DOCUMENTS 0330190 8/1989 European Pat. Off. .
0356302 2/1990 European Pat. Off. .

OTHER PUBLICATIONS

Patent Abstracts of Japan, vol. 10, No. 263 (E-435) (2319) Sep. 9, 1986 & JP,A,61 089 735 (NTT) May 7, 1986, voir abrege.
Electronics Letters. vol. 15, No. 26, Dec. 6, 1979, Stevenage, Herts, GB pp. 280–821; L. D. Auria et al: 'Libido using eros: half-duplex optical link' voir p. 820, colonne de gauche, alinea 1—colonne de droite, alinea 6; Figure 2.
Electronics Letters. vol. 21, No. 11, May 23, 1985, Stevenage GB pp. 511–512; J. P. Van Der Ziel et al: '7.5 km bidirectional single-mode optical-fibre link using dual-mode InGaAsP/Inp 1.3 micrometer laser detectors' voir p. 511, colonne de gauche, alinea 1—alinea 2; Figure 1.

*Primary Examiner*—Georgia Y. Epps
*Attorney, Agent, or Firm*—Oblon, Spivak, McClelland, Maier & Neustadt

[57] ABSTRACT

A bidirectional transmission system with identical laser components. The system features two identical assemblies. Each assembly is constituted by a laser structure able to operate as either an emitter or as a receiver. The system thus has a half-duplex operation. Such a system finds particular application to optical communications.

4 Claims, 3 Drawing Sheets

500 ps/div

BIDIRECTIONAL TRANSMISSION SYSTEM WITH IDENTICAL LASER COMPONENTS

BACKGROUND OF THE INVENTION

1. Field of the Invention

The present invention relates to a bidirectional transmission system with identical laser components.

The preferred field of application of the invention is in wave-division multiplexing (WDM). This procedure uses narrow optical filters as demultiplexers.

2. Discussion of the Background

There have been remarkable advances in optical communications due to the arrival of semiconductor lasers, which are easily amplitude or frequency-modulatable light sources.

Thus, conventionally an optical transmission system comprises a modulated semiconductor laser, a transmission line (such as an optical fiber) and a photoreceiver able to demodulate the optical signal transmitted by the line.

Recently, photoreceivers have been developed, which are particularly suitable for such links. They are laser structures identical to those used for forming emitter lasers, but which operate under special conditions and in particular below the laser effect threshold.

A description of such photoreceivers is provided in:

The article by S. Kobayashi et al entitled "Automatic Frequency Control in a Semiconductor Laser and an Optical Amplifier" published in "Journal of Lightwave Technology", Vol. LT-1, No. 2, June 1983, pp. 394–401.

French patent application FR-A-2 635 423 entitled "Process and apparatus for the optical filtering and photodetection of intensity-modulated optical signals".

The article by K. Magari et al entitled "Optical Signal Selection with a Constant Gain and a Gain Bandwidth by a Multielectrode DFB Laser Amplifier", published in "Applied Physics Letters", 1987, 51, pp. 1974–1976.

The article by T. L. Koch et al entitled "Tunable Multiple-Quantum-Well Distributed-Bragg Reflector Lasers as Tunable Narrowband Receivers", published in "Electronics Letters", Jul. 6, 1989, Vol. 25, No. 14, pp. 890–892.

In the penultimate reference, a description is given of an optical filter tunable to 20.6 GHz and with a bandwidth of 2.9 GHz and formed by a distributed feedback semiconductor structure polarized just below the threshold.

In the final reference a description is given of a tunable resonant amplifying photodetector (TRAP) constituted by a laser structure of the distributed Bragg reflector type and having multiple quantum wells (MQW). When this structure operates at above the threshold, it behaves like a tunable emitter and when it is polarized below the threshold, it is able to receive and demodulate an optical signal. Thus, it was possible to form a 250 mbit/s link with two identical components, the upstream component operating as an emitter and the downstream component as a receiver.

Although the optical links obtained with such components are advantageous in that they only require a single semiconductor structure usable both in emission and reception, they suffer from the disadvantage of their unidirectionality (i.e. they only operate in one direction).

SUMMARY OF THE PRESENT INVENTION

The object of the present invention is to obviate this disadvantage by proposing a system able to ensure a bidirectional link.

According to the invention, this object is achieved by the use of two assembling having the special feature of being identical and which are respectively placed at either end of the transmission line. These two assemblies operate alternately in emission and in reception.

In order to permit this double function, each of these assemblies comprises:

- a semiconductor laser structure having first and second juxtaposed electrodes,
- a first polarization tee having a first branch supplied by a first current source with an intensity below the laser emission threshold and a second branch constituting a signal output, said first tee being connected to the first electrode of the laser structure,
- a second polarization tee incorporating a first branch supplied by a second current source and a second branch supplied by a switching current and by a modulating current, the mean value of the total current intensity exceeding the laser emission threshold, said second tee being connected to the second electrode of the laser structure,
- switching means able to alternately supply the switching current to the second polarization tee of one of the assemblies and then to the second tee of the other, each semiconductor structure thus operating alternately in emission (with the emission of a laser beam modulated by the modulating current applied to the second tee) and in reception (with the supply of a demodulated signal on the second branch of the first tee), so that transmission takes place alternately in the two directions and is consequently bidirectional.

Preferably, the semiconductor structure used is of the distributed feedback type.

The modulation used is either an amplitude modulation of a frequency modulation.

BRIEF DESCRIPTION OF THE DRAWINGS

The invention is described in greater detail hereinafter relative to non-limitative embodiments and the attached drawings, wherein show.

DESCRIPTION OF THE PREFERRED EMBODIMENTS

Figure 1:
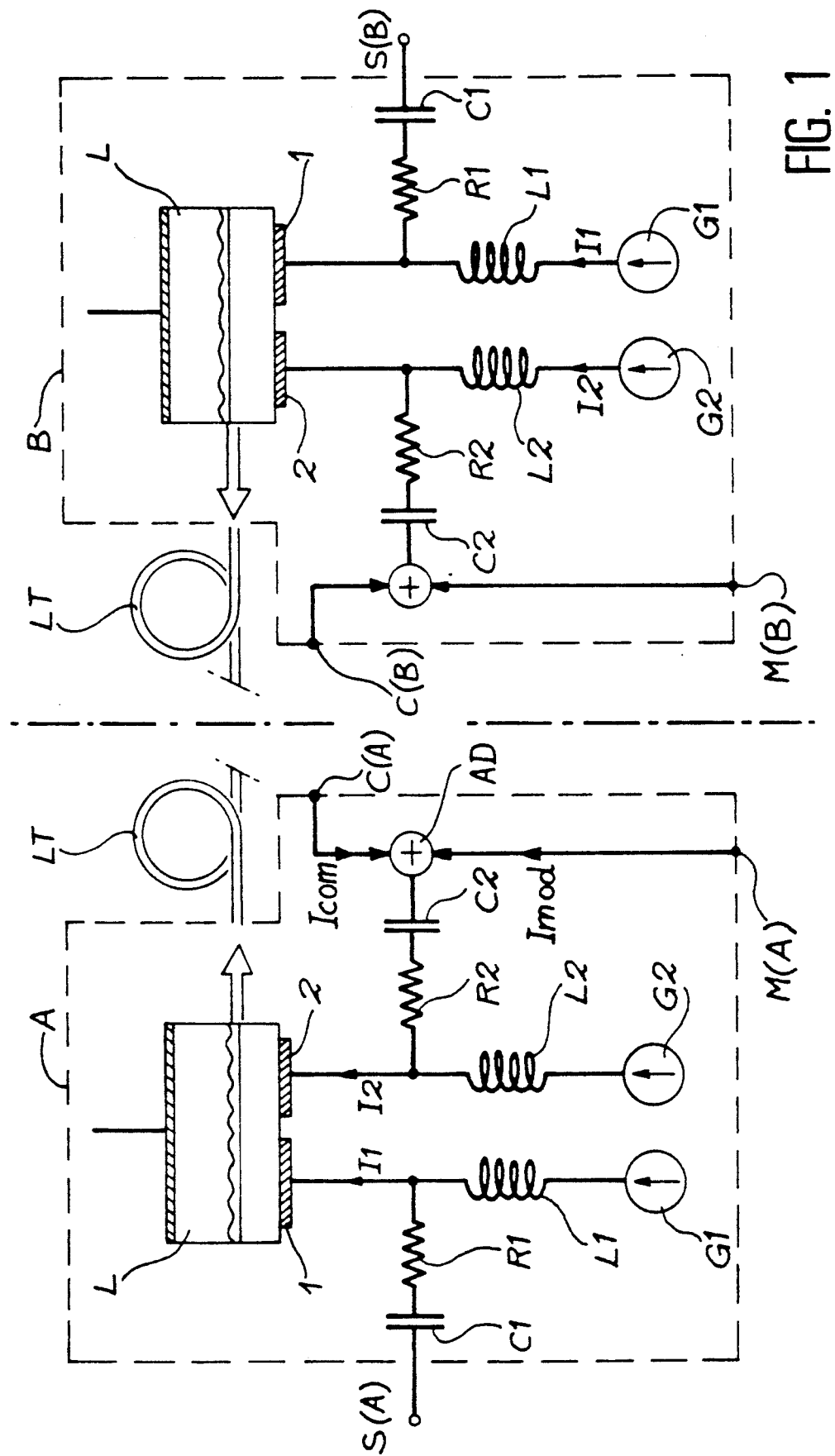
FIG. 1 the structure of the bidirectional system according to the invention.

The system shown in FIG. 1 comprises an optical transmission line LT, e.g. constituted by a monomodal optical fiber, and two identical assemblies A and B respectively placed at the two ends of the line LT.

Each of these assemblies firstly comprises a semiconductor laser structure L provided with a first electrode 1 and a second electrode 2 arranged in juxtaposed manner. Each assembly also comprises two polarization tees. A first tee having a first branch formed by an inductance coil L1 supplied by a first current source G1 of intensity I1 below the laser emission threshold and a second branch formed by a resistor R1 and a capacitor C1. This second branch forms a signal output (S(A) for the assembly A and S(B) for the assembly B), said first tee being connected to the first electrode 1 of the laser structure. A second tee having a first branch formed by an inductance coil L2 supplied by a second current source G2 and a second branch formed by a resistor R2 and a capacitor C2. The second branch receives a switching current Icom and a modulating current Imod. In the illustrated embodiment, the switching current is applied by a switching input, respectively C(A) and C(B) and the modulating current is applied to a modulating input, respectively M(A), M(B). These two currents are added in an adder AD. The mean value I2 of the total intensity of the current exceeds the laser emission threshold, when it functions as an emitter. This second tee is connected to the second electrode of the laser structure.

The switching current Icom is alternately applied to one and then the other of the second polarization tees using the switching inputs C(A), C(B) connected to the second branches of the associated tees. Thus, each semiconductor structure alternately operates as an emitter (with the emission of a laser beam modulated by the modulating current applied to the input M(A) or M(B) and as a receiver (with the supply of a demodulated signal to the output S(A) or S(B) connected to the second branch of the first tee.

Therefore the information is alternately transmitted in the two directions, the link being bidirectional.

Figure 2:
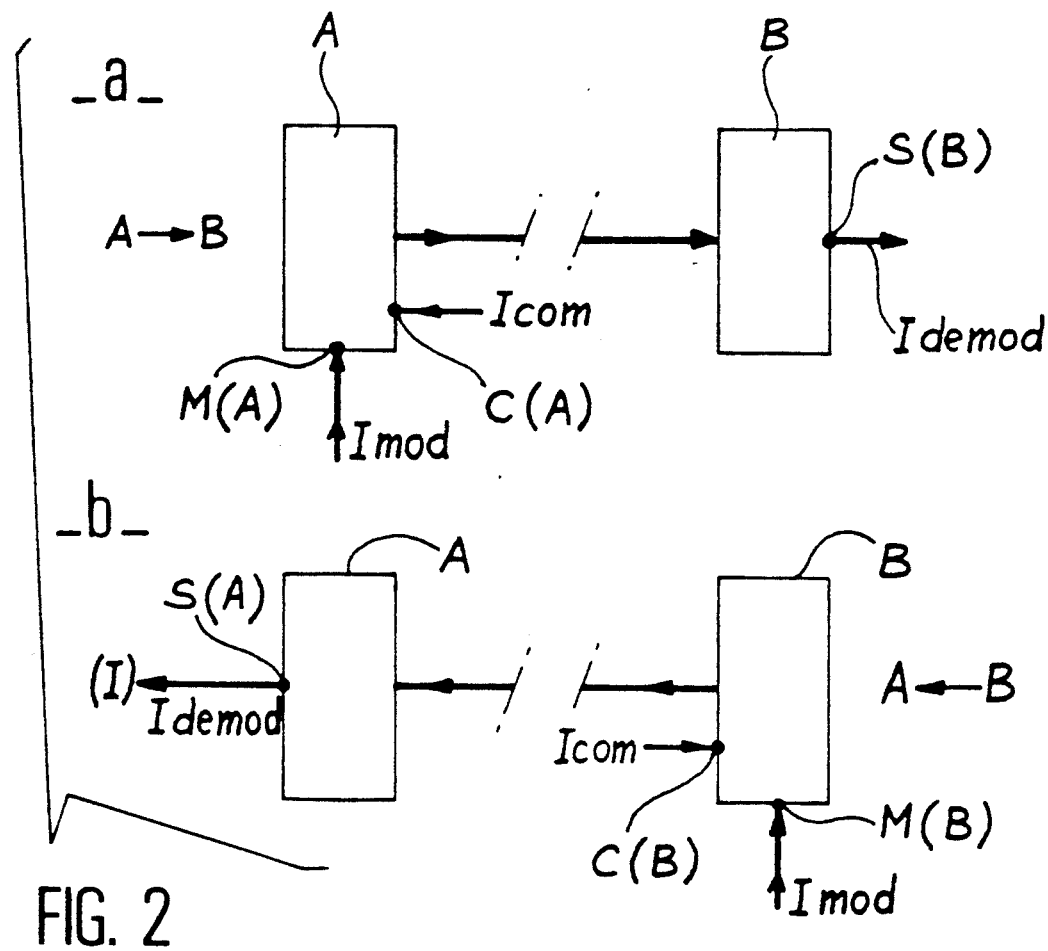
FIG. 2 diagrammatically the two operating phases.

This half-duplex operation is diagrammatically represented in FIG. 2 showing the two alternate phases:

a) Transmission from A to B (part a):

The modulating input M(A) of the assembly A receives a current Imod modulated by the information to be transmitted and said same assembly receives a switching current Icom on its input C(A) and consequently functions as an emitter. The assembly B functions as a receiver and supplies to its output S(B) a current Idemod, which restores the information.

b) Transmission from B to A (part b):

The assembly B receives at its modulating input M(B) a current Imod modulated by the information to be transmitted and a switching current Icom at its input C(B) and consequently functions as an emitter. Assembly A behaves as a receiver and supplies at its output S(A), a current Idemod, which restores the information.

Figure 3:
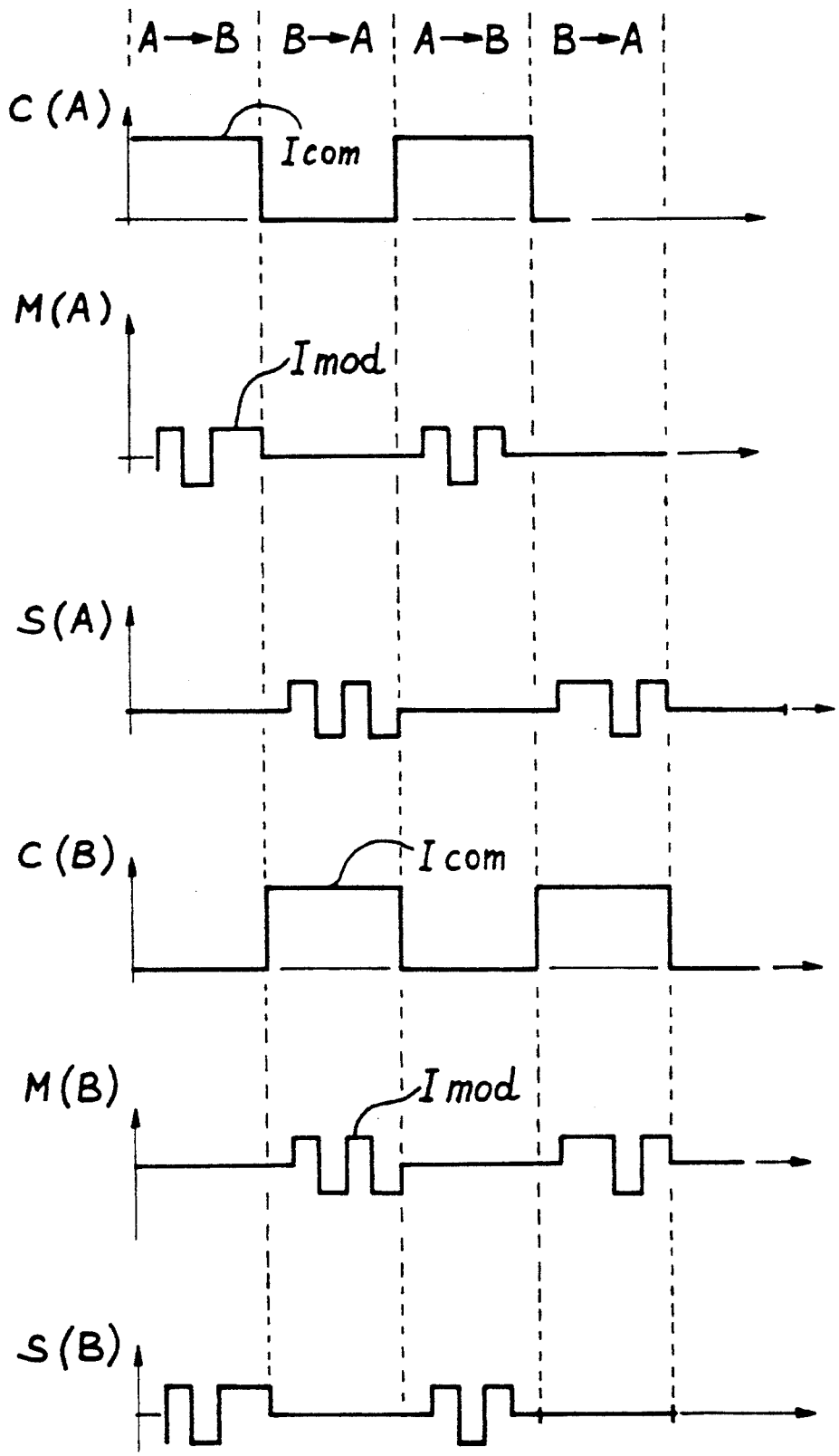
FIG. 3 different signals appearing on various system inputs/outputs.

FIG. 3 shows the pattern of the signals respectively appearing on the switching input C(A) (upper line), the modulating input M(A), the output S(A) of the assembly A, the switching input C(B), the modulating input M(B) and finally the output S(B) of the assembly B (last line). FIG. 3 shows the signals alternately for a transmission from A to B, from B to A, from A to B, etc.

The current applied to the electrode 2 in the emission phase is the sum of the switching current Icom and the modulating current Imod and its mean value exceeds the laser effect threshold.

In the illustrated examples, the modulating current Imod is assumed to be binary modulated by square-wave pulses of variable duration.

In order to illustrate the performance characteristics obtained with a system according to the invention, it is pointed out that the Applicants used as GaInAsP on InP laser structure emitting at 1.515 μm. The structure was of the distributed feedback type (DFB) and with a buried ridge structure (BRS).

Such structures can be produced by metalorganic chemical vapour deposition (MOCVD) in accordance with a procedure described in the article entitled "Ultra-Low Threshold, High-Band with Very Low Noise Operation of 1.52 μm GaInAsP/InP DFB BRS Laser Diodes Entirely Grown by MOCVD", published by M. Krakowski et al. in "IEEE Journal of Quantum Electronics", 1989, 25, pp. 1346-1352.

The electrodes of the structures had lengths of 200 and 300 μm in each case.

On reception, the laser structure operates just below the threshold, namely at about 10 mA. The semiconductor structure considered as an optical filter has a full width half maximum (FWHM) of approximately 5 GHz. The transmission band widens on increasing the injected optical power and has an asymmetry with a sudden drop towards the high frequencies and a shift to the red. The response of the detector laser in frequency modulation is uniform on 1 GHz and decreases by 3 dB at 1.5 GHz.

As an emitter, the structure operates above the threshold with currents exceeding 50 mA. The modulating current is 4 mA peak-to-peak and leads to a frequency excursion of approximately 2 GHz.

Figure 4:
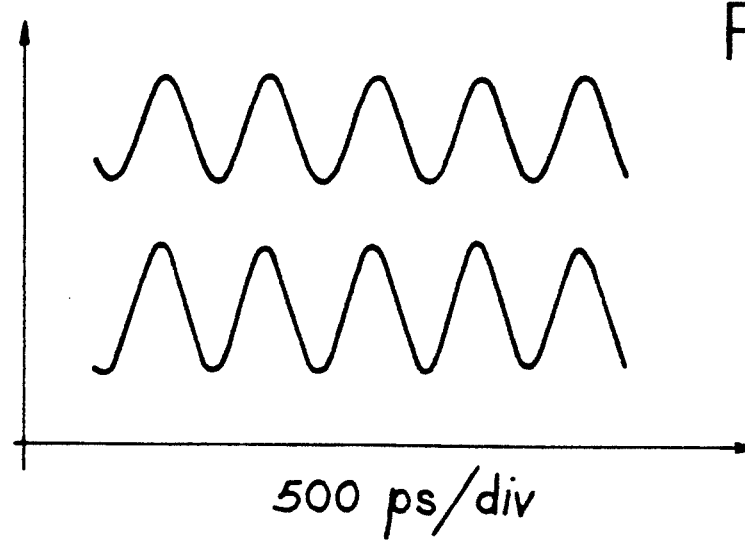
FIG. 4 a modulating signal and a reception signal.

FIG. 4 shows a sine wave (upper line) corresponding to a 1 GHz modulating current applied to the emitter and (lower line) the current supplied to the receiver output. This diagram is obtained in both directions.

For wavelength tuning of the structures, it is necessary to adjust the receiver currents and the emitter currents. Thus, for obtaining in the outward direction the same wavelength of 1.5184 μm on emission and reception, the Applicants applied to the structure operating as an emitter currents I1=5 mA, I2=48 mA and simultaneously, to the structure functioning as the receiver, currents I1=10.3 mA and I2=58 mA.

In the return direction, for an operation at 1.5201 μm, they applied to the emitter laser a current I1 of 22.6 mA and a current I2 of 58 mA and to the receiver laser a current I1 of 5 mA and a current I2 of 22 mA.

Naturally, the system described hereinbefore can function in wavelength multiplexing with several emitters regulated to several wavelengths and several receivers regulated so as to filter the corresponding wavelengths.

We claim:

1. A bidirectional transmission system comprising an optical transmission line and two emission-reception assemblies, wherein the two emission-reception assemblies are identical and each comprises:

a semiconductor laser structure;

first and second electrodes formed on the semiconductor laser structure;

a first polarization tee connected to the first electrode and comprising a first branch supplied by a first current source of an intensity below an emission threshold of the semiconductor laser and a second branch comprising a first signal output, the first polarization tee operating for receiving signals from the semiconductor laser structure and outputting the received signals on the first signal output; and a second polarization tee connected to the second electrode and comprising a first branch supplied by a second current source and a second branch supplied by a selectively applied switching current and a modulating current, wherein when the switching current is applied to the second branch, a mean value of a total intensity of current supplied to the semiconductor laser structure through the second electrode exceeds the emission threshold of the semiconductor laser structure so that the semiconductor laser structure operates in emission.

2. The bidirectional transmission system according to claim 1, wherein the semiconductor laser structure of each emission-reception assembly is a distributed feedback semiconductor laser structure.

3. The bidirectional transmission system according to claim 1, wherein the second branch of the second polarization tee further comprises an adder for adding the selectively applied switching current and the modulating current.

4. The bidirectional transmission system according to claim 1, wherein the second branch of each of the first and second polarization tees comprise a capacitor in series with a resistor.

* * * * *